United States Patent [19]
Maassen et al.

[11] Patent Number: 5,111,050
[45] Date of Patent: May 5, 1992

[54] QUICK COOLDOWN/LOW DISTORTION HYBRID FOCAL PLANE ARRAY PLATFORM FOR USE IN INFRARED DETECTOR DEWAR PACKAGES

[75] Inventors: Nevil Q. Maassen; Timothy S. Romano; Leonard E. Peck, all of Goleta, Calif.

[73] Assignee: Santa Barbara Research Center, Goleta, Calif.

[21] Appl. No.: 621,419

[22] Filed: Dec. 3, 1990

[51] Int. Cl.⁵ .............................................. G01J 5/06
[52] U.S. Cl. ..................................... 250/352; 62/51.1
[58] Field of Search ......................... 250/352; 62/51.1

[56] References Cited

U.S. PATENT DOCUMENTS

| | | | |
|---|---|---|---|
| 4,918,312 | 4/1990 | Wellman et al. | 250/352 |
| 4,952,810 | 8/1990 | Gustafson et al. | 250/352 |
| 4,956,695 | 9/1990 | Robinson et al. | 357/74 |

OTHER PUBLICATIONS

"High Reliability Joining of Ceramic to Metal" American Ceramic Society Bulletin, vol. 68, No. 9, pp. 1591–1599, Sep. 1989 by Mizuhara et al.

Primary Examiner—Carolyn E. Fields
Attorney, Agent, or Firm—W. C. Schubert; W. K. Denson-Low

[57] ABSTRACT

A radiation detector assembly (20) includes a radiation detector (2), a silicon readout device (3) coupled to the radiation detector, and a platform 13 for supporting from a first major surface (13a) the readout device and the radiation detector. A second major surface (13b) includes a boss (14) for coupling, via an active brazing operation, to a cryogenic cooler. The platform is monolithic structure comprised of Aluminum Nitride (AlN) and eliminates at least one adhesive joint found in the prior art. AlN is selected because of its inherent material properties including a higher thermal diffusivity, relative to typical ceramic materials, for providing a reduced cooldown time of the detector to cryogenic temperatures. AlN also has a 300K–77K thermal contraction characteristic that closely matches that of the silicon readout device and a high modulus of elasticity, thereby reducing distortion of the readout device thus minimizing stresses on Indium bump interconnects. AlN also has dielectric characteristics that permit thin film metalization of the surface (13a) for providing electrical signal distribution.

10 Claims, 2 Drawing Sheets

QUICK COOLDOWN/LOW DISTORTION HYBRID FOCAL PLANE ARRAY PLATFORM FOR USE IN INFRARED DETECTOR DEWAR PACKAGES

FIELD OF THE INVENTION

This invention relates generally to focal plane array (FPA) support and cooling apparatus and, in particular, to hybrid FPA support and cooling apparatus that includes a one piece FPA platform. In a presently preferred embodiment, a monolithic FPA platform is comprised of aluminum nitride (AlN) because of this material's properties relating to a thermal contraction characteristic, elastic modulus, dielectric properties, and the enablement of advanced brazing operations that result in a hermetically sealed vacuum enclosure.

BACKGROUND OF THE INVENTION

FIG. 1 illustrates in cross-section an exemplary prior art radiation detector dewar assembly 1. A hybrid FPA (HFPA) includes a radiation detector array 2 that is coupled to a read-out device 3. By example, the radiation detector array 2 is comprised of HgCdTe, the read-out device 3 is comprised of Si and the two are joined by indium bump technology. The read-out device 3 is mounted to an electrically insulating fanout board 4 upon which electrical conductors are distributed and provided, via wiring 5, to interface pins 6 which exit through a backwall 7. In this regard the fanout board is typically comprised of an alumina disk having thin film gold metalization for defining the required electrical conductors. Fanout board 4 is also coupled to a coldshield 8 and to an endcap 9, comprised typically of Invar 36, at which a coldfinger assembly 10 terminates. The coldfinger assembly 10 provides for a cryogenic cooling medium, such as liquid nitrogen, to contact the endcap 9 for cooling the detector array 2 and the coldshield 8. An outer housing 11 supports a transparent window 12 and provides a hermetically sealed vacuum enclosure; the inner volume of the assembly 1 typically being evacuated prior to use.

During fabrication, the relatively thick metal endcap 9 is first brazed to the coldfinger assembly 10 using conventional braze techniques wherein the surfaces to be joined are first given a nickel, or equivalent, metallic coating. To this structure an intermediary platform, the fanout board 4, is adhesively joined. The fanout board 4 provides a stiff and thermally conductive support for the HFPA. The HFPA, through a back surface of the Si readout device 3, is adhesively bonded to the fanout board 4.

The use of this prior art structure presents several problems relating to the fanout board 4 and the structures attached thereto. For example, the fanout board is typically comprised of a ceramic material, such as alumina, in order to provide adequate dielectric properties. However, the ceramic material typically will have a less than optimum thermal diffusivity which results in an appreciable amount of required time to cool the HFPA to cryogenic operating temperatures. Furthermore, the adhesive bonds between the fanout board 4 and the readout device 3 and the coldfinger assembly 10 present additional thermal barriers to rapid cooldown. Also, the ceramic material of the fanout board 4 provides a less than optimum match to the thermal contraction characteristic of the Si readout device 3. As a result, stresses may be generated between the fanout board 4 and the readout device 3 when cooled to cryogenic operating temperatures. These stresses may cause distortion that can adversely effect the indium bump coupling to the detector array 2 and can result in a total failure of some of the bumps. Additional disadvantages relate to the multi-piece construction of the fanout board 4/endcap 9 assembly and the use of adhesive as a joining element. This adhesive joint may be susceptible to the outgassing of organic species, thereby compromising the vacuum integrity of the dewar assembly 1.

It is thus one object of the invention to overcome these and other limitations of conventional radiation detector dewar assemblies.

It is a further object of the invention to provide a monolithic fanout board/endcap assembly having a characteristic of thermal expansion and contraction that is similar to that of a silicon readout device, that furthermore exhibits a high thermal diffusivity for achieving a rapid cooldown time, and which furthermore enables the elimination of the conventional adhesive joint to a coldfinger assembly through advanced brazing techniques.

SUMMARY OF THE INVENTION

The foregoing and other problems are overcome and the objects of the invention are realized by a one piece, low distortion, hybrid focal plane array platform which functions as an integral coldshield support, detector signal fanout board, and critical thermal interface between a dewar cooling device, either cryostat or cryoengine, and a FPA. In a presently preferred embodiment of the invention the platform is comprised of aluminum nitride (AlN). AlN provides a unique combination of preferred material characteristics that are well suited for a detector dewar application.

These properties include the following. AlN provides a higher thermal diffusivity, relative to many ceramic materials, for providing a reduced cooldown time of an infrared detector to cryogenic temperatures. AlN has a 300K-77K thermal contraction characteristic that closely matches that of a silicon readout device. AlN also has an elastic modulus that results in a high degree of stiffness for reducing distortion of the Si readout device. These characteristics increase dewar reliability by minimizing thermal stresses on indium bumps and reducing distortion of the readout device. Furthermore, AlN has dielectric characteristics that permit thin film metalization of the surface for providing electrical signal distribution, thereby eliminating a requirement for the conventional ceramic fanout board. In addition, the integral AlN endcap/AlN platform may be hermetically brazed to the coldfinger assembly without requiring costly metalization techniques required for conventional brazing operations. Also, the monolithic platform/endcap construction made possible by the invention eliminates at least one adhesive bond within the dewar, thereby reducing the potential for outgassing organic species that compromise the vacuum life of the dewar assembly.

BRIEF DESCRIPTION OF THE DRAWING

The above set forth and other features of the invention are made more apparent in the ensuing Detailed Description of the Invention when read in conjunction with the attached Drawing, wherein.

DETAILED DESCRIPTION OF THE INVENTION

Figure 1:
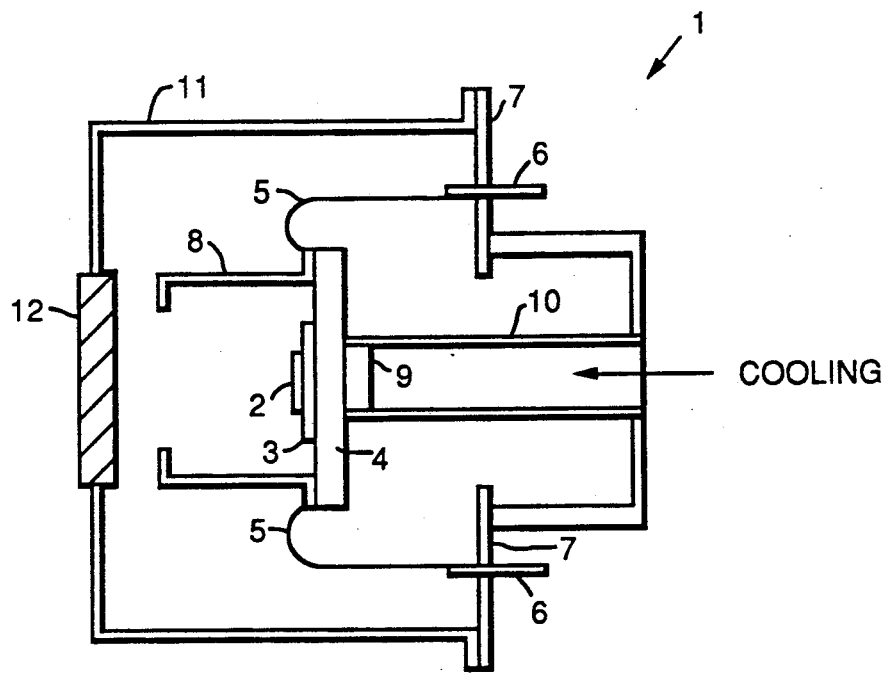
FIG. 1 is a cross-sectional view of a conventional radiation detector dewar assembly.
Figure 2:
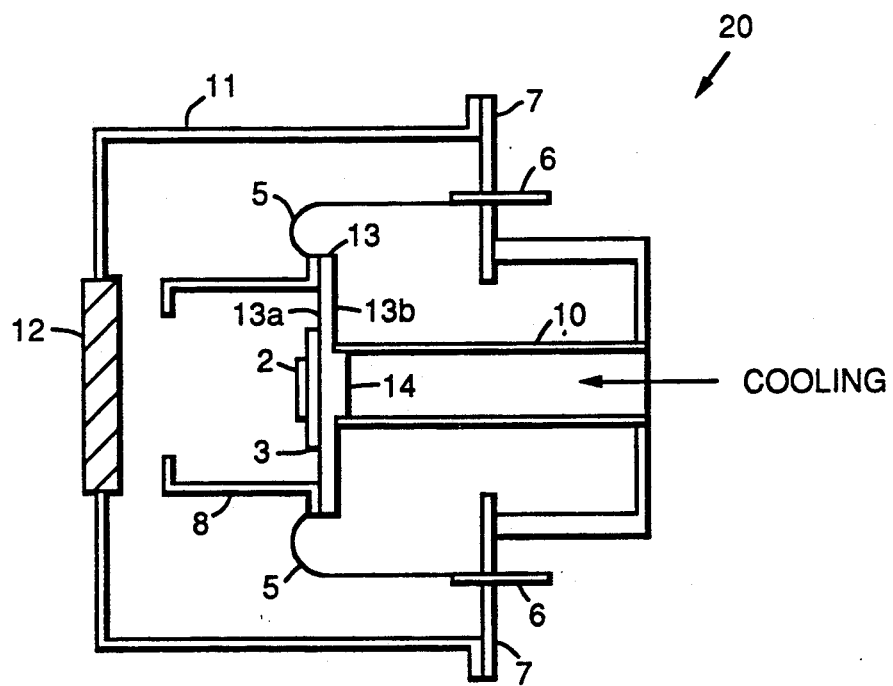
FIG. 2 is a cross-sectional view of a radiation detector dewar assembly constructed in accordance with the invention.

Referring to FIG. 2 there is illustrated in cross-section, not to scale, a radiation detector dewar assembly 20 constructed in accordance with the invention, wherein reference numerals in common with FIG. 1 indicate identical structure. In FIG. 2 the fanout board 4 and endcap 9 of FIG. 1 are replaced by a one piece monolithic platform 13. Platform 13 is comprised of, in a presently preferred embodiment of the invention, AlN (mol. wt. 40.99, Al 65.82%, N 34.18%). Of course, the AlN material may also contain binders and other additives so long as the desirable material properties of AlN, described below, are not significantly compromised.

Figure 3:
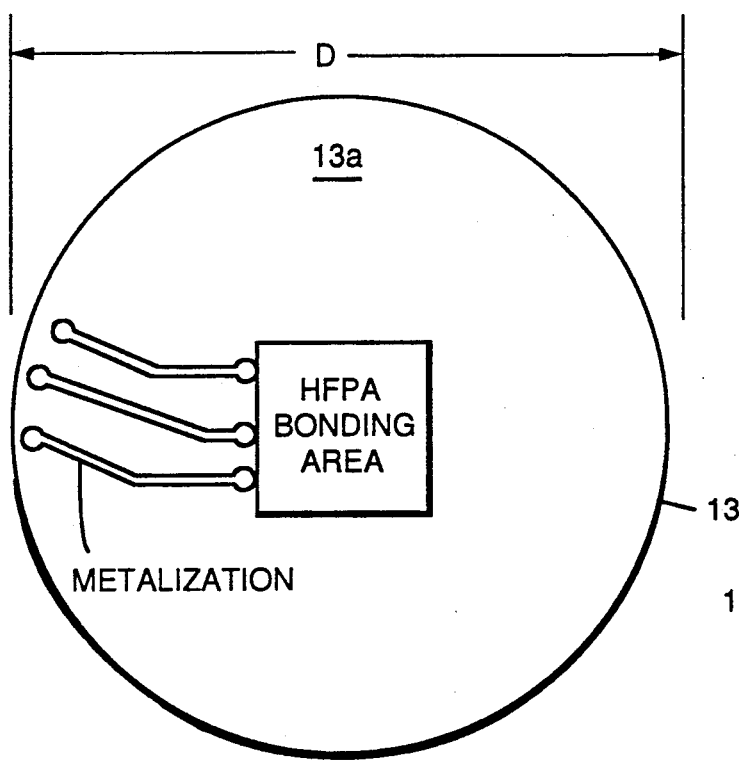
FIG. 3 is a front view, not to scale, of the FPA platform showing a portion of the thin-film metalization applied to the front surface.
Figure 4:
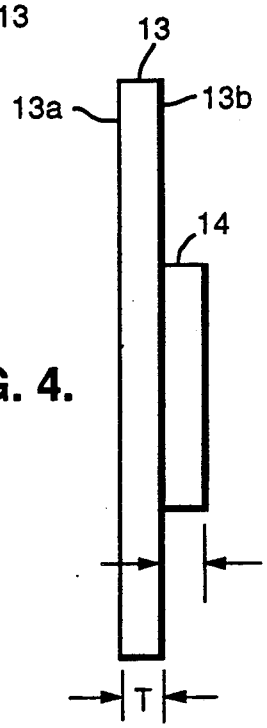
FIG. 4 is a side view of the FPA platform.
Figure 5:
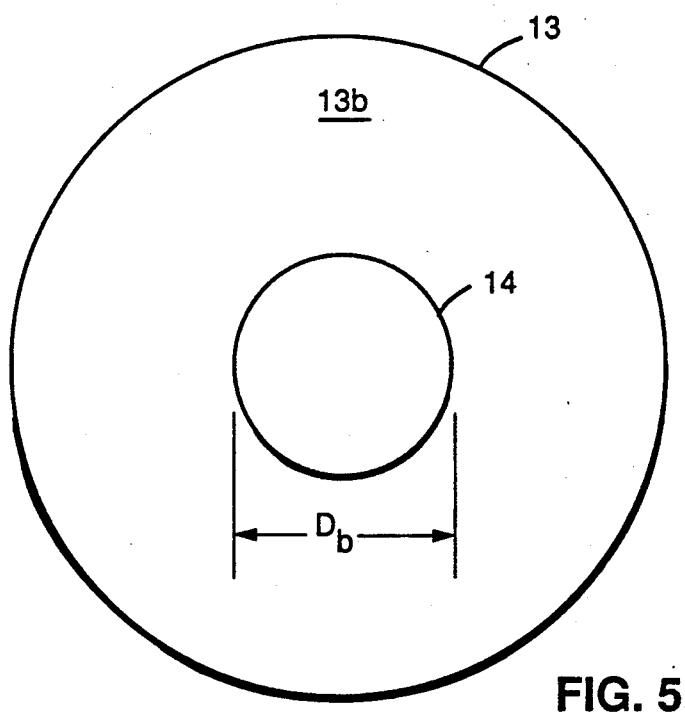
FIG. 5 is a back view of the FPA platform.

Referring now also to FIGS. 3, 4 and 5, in the illustrated embodiment platform 13 has a generally circular disk shape having a planar front surface 13a for mounting the Si readout device 3 and a protruding extension or boss 14 on a back surface 13b. The protruding boss 14 functions as a structural, vacuum, and thermal interface to the coldfinger tube 10. That is, the boss 14 functions as the metal endcap 9 of FIG. 1. The platform 13 may be fabricated by machining a block of AlN to the desired shape or may be cast in the desired shape. Of course, other than a generally circular disk shape may be provided.

By example, the platform 13 has a thickness (T) of approximately 0.02 inches and a diameter (D) of approximately 0.75 inches. The height (H) of the boss 14 from the back surface 13b is approximately 0.02 inches, the boss 14 having a diameter ($D_d$) of approximately 0.35 inches. These dimensions are exemplary only and, in practice, the AlN platform 13 may be fabricated to any desired shape and dimensions.

The use of AlN as the platform 13 material provides the following significant advantages in the construction and operation of the radiation detector dewar assembly 20.

An improvement in cooldown time is achieved because of reduced platform thickness and the elimination of thermal interfaces, as compared to the prior art. For example, the adhesive joint between the endcap 9 and the fanout board 4 of FIG. 1 is eliminated in that the equivalent structure is provided in the monolithic shape of the platform 13. Also, AlN exhibits an inherently high thermal diffusivity as compared to the prior art materials. The 300K to 77K integrated thermal diffusivity of AlN is approximately three times that of the prior art alumina fanout board 4.

The elimination of an extra piece part and related processing steps is achieved by combining the detector platform with the fanout board 9. In that the AlN platform 13 exhibits good dielectric characteristics the surface 13a may also be patterned and thin film metalized to form the conductors for coupling to the HFPA. The platform 13 thus functions as the fanout board, thereby eliminating the need for an additional alumina metalized mounting board with its associated thermal mass and thermal interface. A portion of the thin film metalization is shown in FIG. 3. The thin film metalization may be comprised of a thin layer of titanium, to promote adhesion to the AlN, and a relatively thicker layer of gold overlying the titanium. The HFPA is wire-bonded to the metalization as in the prior art structure of FIG. 1. The HFPA is attached directly to the AlN platform 13 using an adhesive. The coldshield 8 is also adhesively bonded to the surface 13a using, for example, a silicone-based adhesive.

Also achieved through the use of the AlN platform 13 is an improved detector readout reliability because of the close match between the 300K-77K thermal contraction characteristics of Si and AlN. For example, the 300K-77K thermal contraction characteristic of AlN is on the order of 0.32 mils/inch while that of Si is on the order of 0.26 mils/inch over the same temperature range, whereas the prior art alumina platform material has a value on the order of 0.73 mils/inch over the same temperature range. As can readily be seen, the prior art alumina platform has a contraction characteristic nearly three times that of silicon while AlN differs by only several percent. This relatively close match results in reduced thermal stress between the FPA platform 13 and the readout device 3.

Also, the elastic modulus, on the order of $40 \times 10^6$, of AlN provides a high stiffness minimizing any distortion of the readout device 3. Although the elastic modulus of alumina is on the order of $50 \times 10^6$, the other inferior properties of this material, such as the larger thermal contraction characteristic and lower thermal diffusivity, make AlN a superior material for use in cryogenic dewar applications.

Another significant advantage conferred by the use of the invention is that state-of-the-art active metal brazing techniques may be employed to hermetically braze the platform 13 onto the end of the lower vacuum assembly. The platform 13 brazement is accomplished using an active braze alloy.

The active brazing of ceramic material is described in an article entitled "High Reliability Joining of Ceramic to Metal", American Ceramic Society Bulletin, Vol. 68, No. 9, pages 1591-1599, September 1989 by H. Mizuhara et al.

For the active brazing operation the conventional sputter metalization of, by example, titanium-nickel followed by a nickel plate is avoided, thereby further reducing manufacturing cost. Also, vacuum life is extended by elimination of the adhesive joint interface at the endcap/platform of FIG. 1. That is, the AlN platform 13 is directly brazed to the coldfinger tube 10 thereby reducing the possibility of vacuum failure due to outgassing of organic species from the adhesive joint required by the prior art to join fanout board 4 to the endcap 9. This furthermore results in lower overall manufacturing costs because of the elimination of the separate platform/endcap pieces and the required bonding operation. Also, the platform 13 constructed in accordance with the invention does not preclude the use of either cryostat or cryoengine cooling devices.

The active brazing operation is accomplished to join the AlN platform 13, specifically the boss 14, to the end of the coldfinger tube 10. Prior to joining the two assemblies an active brazing alloy, such as Cusil-ABA (available from Wesgo of Belmont, Calif.) is applied about the boss 14. The boss 14 is inserted into the end of the coldfinger tube 10 and the two assemblies are placed in a vacuum furnace and heated to approximately 1600° F. for approximately five minutes. When removed from the furnace a hermetic braze joint is found to be established between the AlN platform 13 and the coldfinger tube 10.

Active brazing is a presently preferred technique due to the difficulty in providing a metal adhesion layer for braze purposes onto insulating materials, such as the AlN material, prior to a conventional brazing operation. Furthermore, the elimination of the conventional required metal plating operations results in increased manufacturing efficiencies and cost savings.

While the invention has been particularly shown and described with respect to a preferred embodiment thereof, it will be understood by those skilled in the art that changes in form and details may be made therein without departing from the scope and spirit of the invention.

What is claimed is:

1. A platform for use with a cryogenically cooled radiation detector means, the platform having a first major surface comprising means for supporting the radiation detector means thereon and an opposed second major surface having an upstanding portion extending therefrom, the upstanding portion being integrally formed and continuous with the second major surface and having a shape selected for coupling to a cryogenic cooling apparatus, wherein the platform is comprised of aluminum nitride.

2. A platform as set forth in claim 1 and further comprising a plurality of electrically conductive metallic traces formed upon the first major surface, the traces being disposed for being coupled to the radiation detector means.

3. A platform as set forth in claim 1 wherein the platform has a generally circular disk shape.

4. A platform as set forth in claim 3 wherein the platform has a diameter of approximately 0.75 inches and a thickness of approximately 0.02 inches.

5. A platform as set forth in claim 3 wherein the upstanding portion has a generally circular disk shape and where the diameter of the upstanding portion is less than a diameter of the platform.

6. A platform as set forth in claim 5 wherein the platform has a diameter of approximately 0.75 inches and a thickness of approximately 0.02 inches and wherein the upstanding portion has a diameter of approximately 0.35 inches and a thickness of approximately 0.02 inches.

7. A radiation detector assembly comprising:
a radiation detector;
a readout device coupled to the radiation detector; and
platform means for supporting from a first major surface thereof the readout device and the radiation detector, the platform means including an integrally formed upstanding boss that extends from a second major surface of the platform means, the boss having a shape selected for coupling to a cryogenic cooling apparatus, the platform means being comprised of aluminum nitride.

8. A radiation detector as set forth in claim 7 wherein the first major surface includes a plurality of conductors formed thereon for electrically coupling to the readout device.

9. A radiation detector assembly comprising:
a radiation detector;
a readout device coupled to the radiation detector;
platform means, comprised of aluminum nitride, for supporting from a first major surface thereof the readout device and the radiation detector, the platform means including means monolithically formed with and extending from a second opposing major surface thereof for coupling to a cryogenic cooling apparatus, the platform means further including electrically conductive traces formed on the first surface for coupling the readout device to electrical terminals;
coldshield means coupled to the first major surface of the platform means and extending outwardly therefrom for substantially enclosing the radiation detector within an internal volume thereof; and
housing means including a window positioned for passing externally generated radiation to an aperture within the coldshield means, the housing means defining a vacuum enclosure within which the platform means and coldshield means are disposed.

10. A radiation detector assembly as set forth in claim 9 wherein the readout device is comprised of silicon.

* * * * *